(12) United States Patent
Chua

(10) Patent No.: US 12,044,385 B2
(45) Date of Patent: Jul. 23, 2024

(54) LIGHT SYSTEM USING FLEXIBLE PRINTED CIRCUIT BOARDS

(71) Applicant: SWS WARNING LIGHTS INC., Niagara Falls (CA)

(72) Inventor: Rainier Chua, Niagara Falls (CA)

(73) Assignee: SWS WARNING LIGHTS INC., Niagara Falls (CA)

( * ) Notice: Subject to any disclaimer, the term of this patent is extended or adjusted under 35 U.S.C. 154(b) by 0 days.

(21) Appl. No.: 18/533,728

(22) Filed: Dec. 8, 2023

(65) Prior Publication Data

US 2024/0200757 A1 Jun. 20, 2024

(30) Foreign Application Priority Data

Dec. 16, 2022 (CA) ...................................... 3184321

(51) Int. Cl.
| | |
|---|---|
| F21V 19/00 | (2006.01) |
| F21V 23/04 | (2006.01) |
| F21V 29/70 | (2015.01) |
| F21Y 107/40 | (2016.01) |
| F21Y 107/70 | (2016.01) |
| F21Y 113/00 | (2016.01) |
| F21Y 115/10 | (2016.01) |

(52) U.S. Cl.
CPC ........ *F21V 19/003* (2013.01); *F21V 23/0442* (2013.01); *F21V 29/70* (2015.01); *F21Y 2107/40* (2016.08); *F21Y 2107/70* (2016.08); *F21Y 2113/00* (2013.01); *F21Y 2115/10* (2016.08)

(58) Field of Classification Search
CPC .... F21V 19/003; F21V 23/0442; F21V 29/70; F21Y 2107/40; F21Y 2107/70; F21Y 2113/00; F21Y 2115/10
See application file for complete search history.

(56) References Cited

U.S. PATENT DOCUMENTS

| | | | |
|---|---|---|---|
| 10,847,701 B2 | 11/2020 | Nevins et al. | |
| 2007/0268703 A1* | 11/2007 | Gasquet | H05K 1/0204 362/294 |
| 2013/0240920 A1* | 9/2013 | Lin | F21K 9/232 257/89 |

(Continued)

*Primary Examiner* — Kevin Quarterman
(74) *Attorney, Agent, or Firm* — Husch Blackwell LLP

(57) ABSTRACT

A light system comprises at least three separate individual rigid metal LED heat sinks each having a respective substantially planar outwardly facing LED support surface and a flexible printed circuit board. The flexible printed circuit board comprises a flexible substrate carrying a plurality of LEDs, electrical control components, electrical input components and electrical traces. LED regions of the flexible printed circuit board carrying the LEDs are disposed on the outwardly facing LED support surfaces with light-emitting surfaces of the LEDs outwardly facing. Adjacent LED heat sinks are foldably coupled to one another by joints formed by fold regions of the flexible printed circuit board extending between respective spaced-apart edges of the adjacent ones of the LED heat sinks. Each adjacent pair of the outwardly facing LED support surfaces are non-parallel to one another whereby the outwardly facing LED support surfaces are disposed on notional faces of a notional polyhedron.

14 Claims, 14 Drawing Sheets

(56) References Cited

U.S. PATENT DOCUMENTS

| | | | |
|---|---|---|---|
| 2014/0292176 A1* | 10/2014 | Athalye | F21V 29/503 |
| | | | 313/46 |
| 2016/0363268 A1* | 12/2016 | Kim | F21S 43/14 |
| 2018/0195701 A1* | 7/2018 | Beijer | F21K 9/90 |
| 2018/0283665 A1 | 10/2018 | Roth et al. | |
| 2019/0211983 A1* | 7/2019 | Shine | F21V 15/015 |
| 2020/0056772 A1* | 2/2020 | Zhu | F21V 17/12 |
| 2021/0321509 A1 | 10/2021 | Jung | |

* cited by examiner

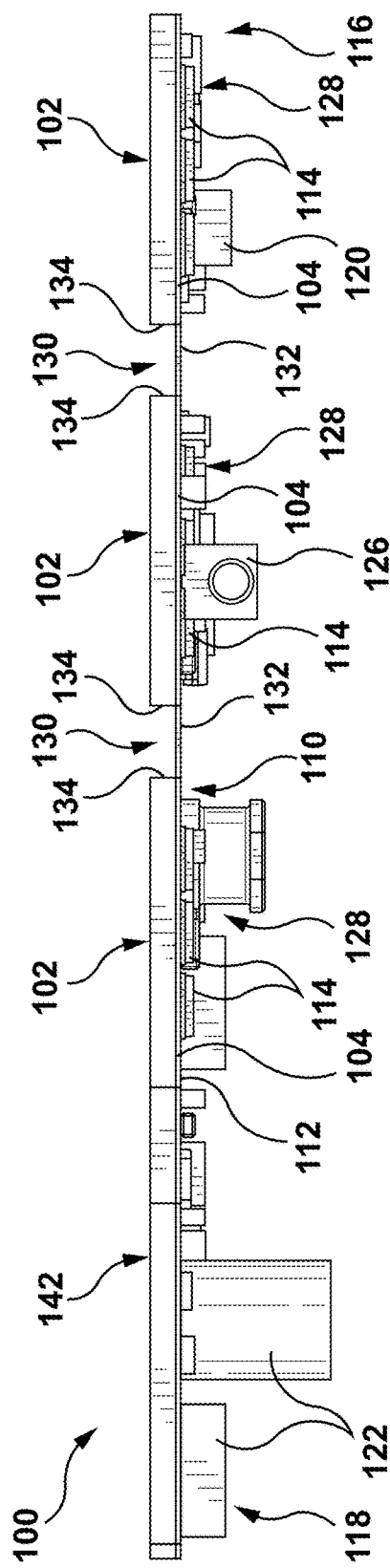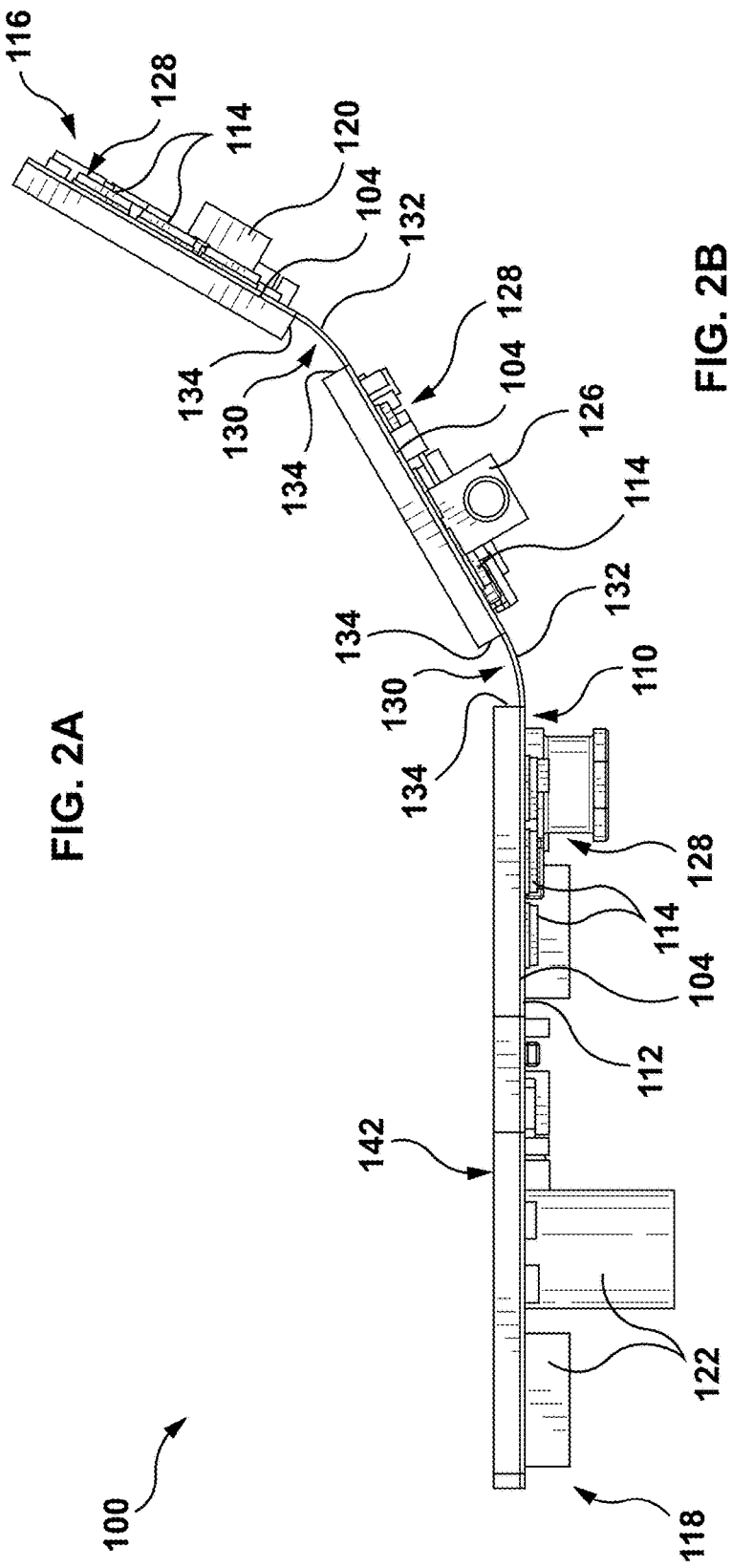

LIGHT SYSTEM USING FLEXIBLE PRINTED CIRCUIT BOARDS

CROSS-REFERENCE TO RELATED APPLICATIONS

This applications claims priority to Canadian patent application No. CA3184321 filed Dec. 16, 2022 under 35 U.S.C. § 119(a), which is incorporated herein by reference in its entirety.

TECHNICAL FIELD

The present disclosure relates to light systems, and more particularly to LED light systems.

BACKGROUND

Warning light systems and emergency light systems (so-called "flashing lights") are ubiquitous among emergency vehicles such as police, ambulance and firefighting vehicles, as well as construction vehicles, among others. Modern light systems use light emitting diodes (LEDs) on a printed circuit board. The LEDs are typically configured to meet a color standard, for example the SAE J578 color test under the SAE J845 (2013) Class 1 standard. While cooler than incandescent lights, LEDs can nonetheless generate considerable heat.

To manage the heat from the LEDs, a metal heat sink can be coupled to the printed circuit board. The metal heat sink can absorb a considerable amount of heat while providing an enlarged surface area to dissipate that heat. Incorporating a metal heat sink into the light systems and interfacing them with the printed circuit board that carry the LEDs complicates the manufacturing process, however, because the LEDs must be configured to produce the desired lighting effect. For example, bending a metal heat sink into a desired shape adds considerably to labor costs.

SUMMARY

In one aspect, a light system comprises at least three separate individual rigid metal LED heat sinks each having a respective substantially planar outwardly facing LED support surface and a flexible printed circuit board. The flexible printed circuit board comprises a flexible substrate, a plurality of LEDs carried by the substrate, a plurality of electrical control components carried by the substrate and adapted for selectively controlling illumination of the LEDs, a plurality of electrical input components carried by the substrate and connectible in electrical communication with an electrical source to supply electrical power to the flexible printed circuit board, and a plurality of electrical traces carried by the substrate and in electrical communication with the LEDs, the electrical control components and the electrical input components. The electrical traces are configured to cooperate with the electrical control components and the electrical input components to form a circuit configured to carry current from the electrical source through the LEDs and back to the electrical source under control of the electrical control components and the electrical input components. LED regions of the flexible printed circuit board carrying the LEDs are disposed on the outwardly facing LED support surfaces of the LED heat sinks whereby the LED heat sinks can dissipate heat from the LEDs and wherein light-emitting surfaces of the LEDs are outwardly facing. Adjacent ones of the LED heat sinks are foldably coupled to one another by joints formed by fold regions of the flexible printed circuit board extending between respective spaced-apart edges of the adjacent ones of the LED heat sinks. The LED heat sinks are arranged relative to one another so that each adjacent pair of the outwardly facing LED support surfaces are non-parallel to one another whereby the outwardly facing LED support surfaces are disposed on notional faces of a notional polyhedron.

In some embodiments, the notional polyhedron is a notional prism and the outwardly facing LED support surfaces are disposed on notional lateral faces of the notional prism. In some particular embodiments, the outwardly facing LED support surfaces are disposed on all of the notional lateral faces of the notional prism. In some particular embodiments, one of the outwardly facing LED support surfaces is disposed on a base face of the notional prism.

In some embodiments, the notional prism is a notional triangular prism. In other embodiments, the notional prism is a notional rectangular prism.

In some embodiments, the light system further comprises a supplemental internal heat sink that is thermally coupled to the LED heat sinks and is disposed within the notional polyhedron.

In some embodiments, the light system further comprises a base wherein the LED heat sinks are securely potted onto the base. In particular embodiments, the LED heat sinks, the flexible printed circuit board and the base are disposed within an enclosure comprising a pedestal supporting the base and a translucent housing that cooperates with the pedestal to form the enclosure. In some particular embodiments, the housing is transparent. In other particular embodiments, the housing comprises a filter interposed between the LEDs and a notional viewer, the filter being configured to suppress light outside of a target color region. The target color region may be, for example, an SAE J578 specification for one of white, red, amber, green, restricted blue and signal blue. In some embodiments, the housing comprises a Fresnel lens.

In some embodiments, the light system further comprises a photosensor carried by the substrate. The photosensor is in electrical communication with the electrical control components and the electrical control components are adapted for selectively controlling illumination of the LEDs at least partially according to input from the photosensor.

BRIEF DESCRIPTION OF THE DRAWINGS

These and other features will become more apparent from the following description in which reference is made to the appended drawings wherein:

FIGS. 2A to 2C show how heat sinks of the beacon skeleton of FIG. 1 may be folded to form a generally triangular shape;

DETAILED DESCRIPTION

Figure 1:
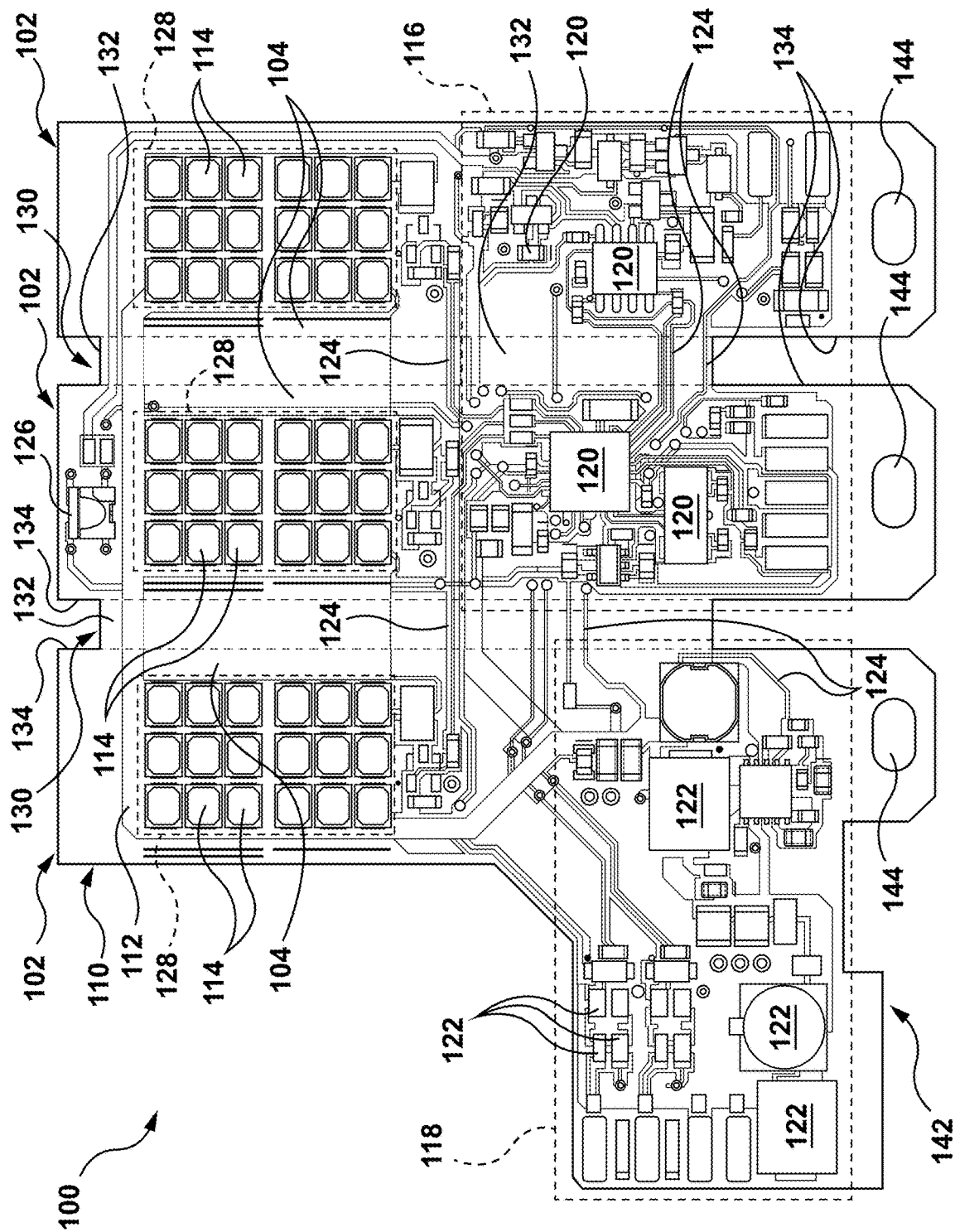
FIG. 1 shows a plan view of a first illustrative beacon skeleton for forming a light beacon in an unfolded configuration.

Reference is now made to FIG. 1, which shows a first illustrative beacon skeleton 100 for forming a light beacon in an unfolded configuration. The beacon skeleton 100 comprises a plurality of separate individual rigid metal LED heat sinks 102. Preferably, the heat sinks 102 are made from aluminum or an aluminum alloy, although other suitable materials may also be used. In the illustrative beacon skeleton 100 there are three individual LED heat sinks 102; other embodiments may have four, five or more individual LED heat sinks 102. Each of the LED heat sinks 102 has a respective substantially planar LED support surface 104 which will be outwardly facing when the beacon skeleton 100 is formed into a light beacon.

The beacon skeleton 100 further comprises a flexible printed circuit board 110. The flexible printed circuit board 110 comprises a flexible substrate 112, a plurality of light-emitting diodes (LEDs) 114 carried by the substrate 112, an electrical control module 116 carried by the substrate 112, and a power supply module 118 carried by the substrate 112 and connectible in electrical communication with an electrical source, for example a vehicle battery, to supply electrical power to the flexible printed circuit board 110.

The electrical control module 116 comprises a plurality of electrical control components 120 adapted for selectively controlling illumination of the LEDs 114, and the power supply module 118 comprises a plurality of electrical input components 122. A plurality of electrical traces 124 are carried by the substrate 112 and are in electrical communication with the LEDs 114, the electrical control components 120 and the electrical input components 122. The substrate 112 may comprise an insulating base layer, a trace layer containing the electrical traces 124, and an overlayer, which may also be an insulating layer. Preferably, the substrate 112, in particular the insulating base layer thereof, is disposed directly on the heat sinks 102 without any intervening material other than adhesive to secure the substrate 112 to the heat sinks 102. In some embodiments, there may be some portions of the substrate 112 other than those disposed on the heat sink 102, which are disposed on other materials, such as FR4 board.

The electrical control components 120 making up the electrical control module 116 may provide central processing unit, programming and communication functionality, and the electrical input components 122 making up the power supply module 118 may provide input, power supply, filter and related functions. The electrical traces 124 are configured to cooperate with the electrical control components 120 and the electrical input components 122 to form a circuit configured to carry current from the electrical source through the LEDs 114 and back to the electrical source under control of the electrical control components 120 and the electrical input components 122. Configuration of the electrical control components 120, the electrical input components 122 and the electrical traces 124 to achieve the aforesaid functionality is within the capability of one skilled in the art, as informed by the present disclosure. Additionally, in order to avoid cluttered drawings, only some of the electrical control components 120, electrical input components 122 and electrical traces 124 are labeled in the drawings for purposes of illustration.

In the illustrated embodiment, an optional photosensor 126 is carried by the substrate 112. The photosensor 126 is in electrical communication, via the electrical traces 124, with the electrical control components 120 and the electrical control components 120 are adapted for selectively controlling illumination of the LEDs 114 at least partially according to input from the photosensor 126.

In the illustrative embodiment shown in FIG. 1, all of the electrical control components 120 making up the electrical control module 116, and all of the electrical input components 122 making up the power supply module 118, are positioned within a control region and a power supply region, respectively, of the substrate 112 and the control region and power supply region are disposed on the LED heat sinks 102. However, this is merely one illustrative embodiment and is not limiting. In other embodiments, some of the electrical control components 120 making up the electrical control module 116 and/or some of the electrical input components 122 making up the power supply module 118 may be disposed elsewhere.

Continuing to refer to FIG. 1, it can be seen that LED regions 128 of the flexible printed circuit board 110 carrying the LEDs 114 are disposed on the LED support surfaces 104 of the LED heat sinks 102 whereby the LED heat sinks 102 can dissipate heat from the LEDs 114. For example, the LED regions 128 of the flexible printed circuit board 110 may be adhered to the LED heat sinks 102 by a suitable adhesive, or by a direct deposition process. While the figures show two distinct arrangements of LEDs 114 each in a three-by-three matrix for each heat sink 102, this is merely one illustration and a wide range of LED configurations is contemplated. For example, there may be only one three-by-three matrix of LEDs for each heat sink, in either the upper or lower position. Additionally, it can be seen that adjacent ones of the separated LED heat sinks 102 are spaced apart from one another and are foldably coupled to one another by joints or hinges 130 formed by fold regions 132 of the flexible printed circuit board 110 extending between respective spaced-apart edges 134 of the adjacent ones of the LED heat sinks 102. The fold regions 132 of the flexible printed circuit board 110 preferably contain only electrical traces 124 and none of the of the electrical control components 120 making up the electrical control module 116 or the electrical input components 122 making up the power supply module 118 are disposed in the fold regions 132.

Figure 2C:
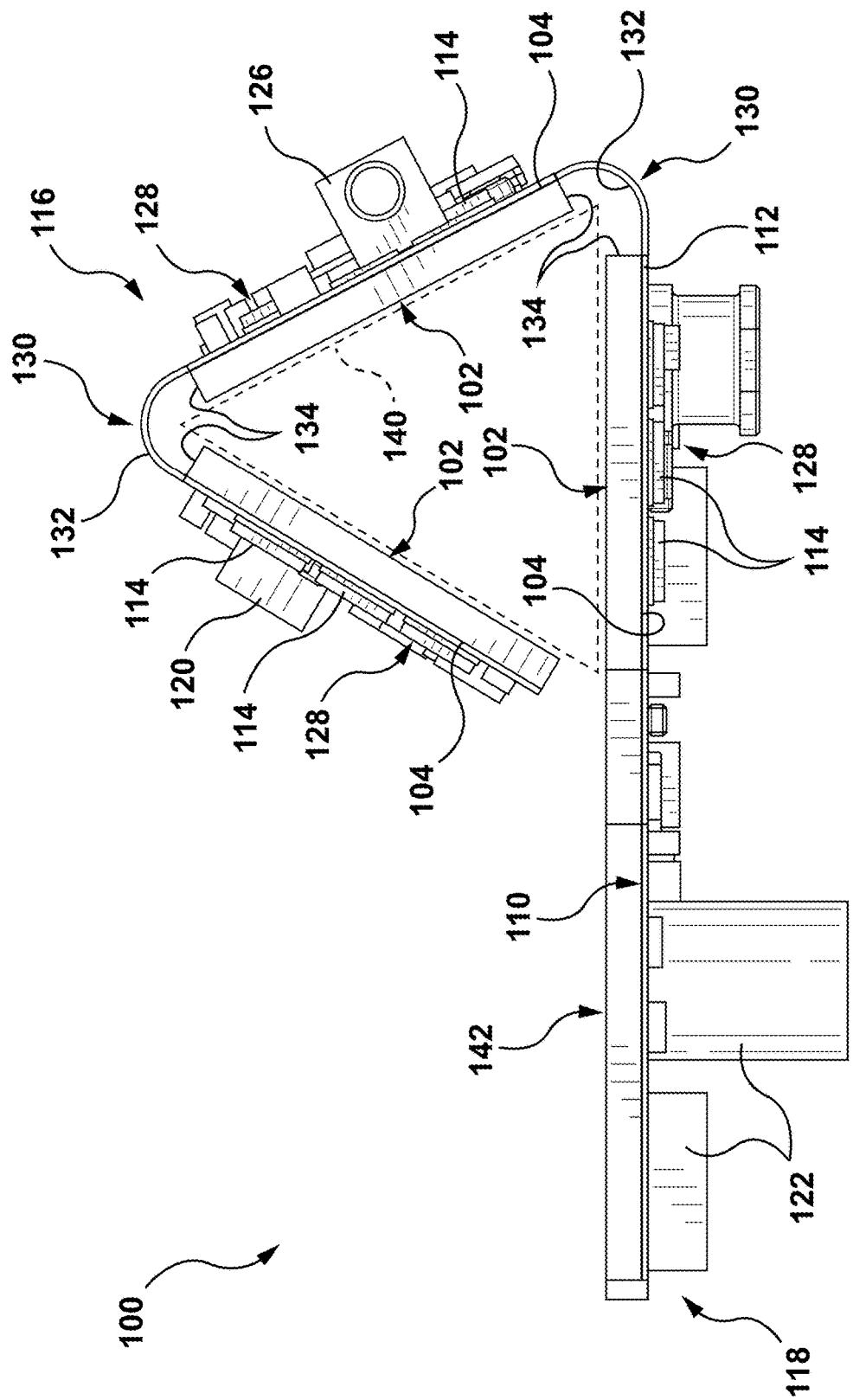

The fold regions 132 allow the LED heat sinks 102 to be folded toward one another into a desired shape. FIGS. 2A to 2C show how the beacon skeleton may be folded by folding the LED heat sinks 102 toward one another to form a generally triangular shape 140 (FIG. 2C). While two of the LED heat sinks 102 are generally rectangular in shape, one of the LED heat sinks 102 is L-shaped and includes an extended portion 142 for supporting the electrical input components 122 making up the power supply module 118; this extended portion 142 extends beyond the generally triangular shape 140.

In order to avoid cluttered drawings, details of the flexible printed circuit board 110, including the flexible substrate 112, electrical traces 124 and LED regions 128 thereof, are not separately shown or marked in FIGS. 3 to 6, with only the fold regions 132 shown for clarity of illustration.

Figure 3:
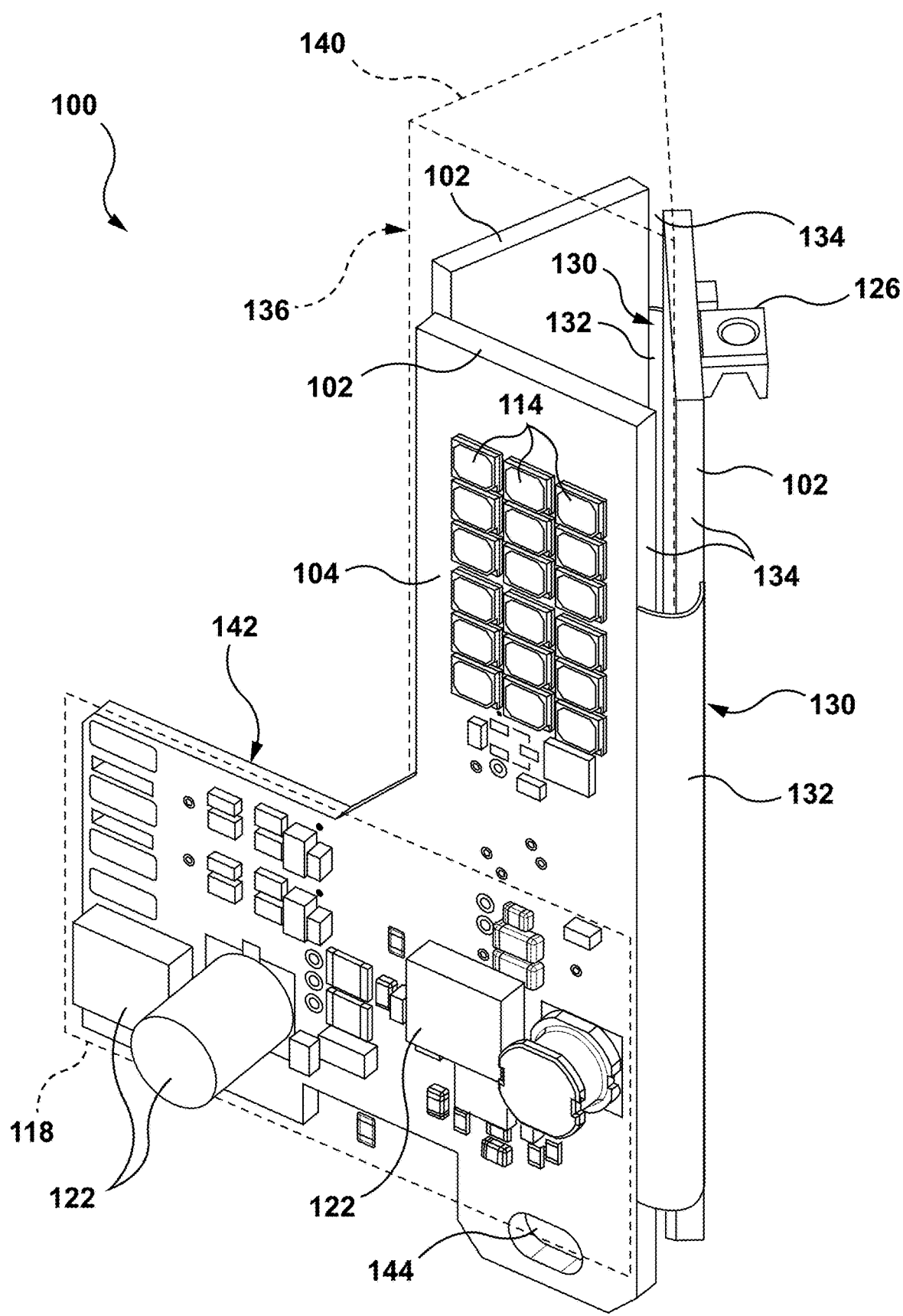
FIG. 3 is a top perspective view of the beacon skeleton of FIG. 1 folded to form the generally triangular shape.

Referring now to FIG. 3, it can be seen that when the three LED heat sinks 102 are folded into the generally triangular shape 140, the LED support surfaces 104 face outwardly and define a notional polyhedron, particularly a notional prism and more particularly a notional regular triangular prism 136. Thus, the LED heat sinks 102 are arranged relative to one another so that each adjacent pair of the outwardly facing LED support surfaces 104 are non-parallel to one another, with the outwardly facing LED support surfaces 104 disposed on all of the notional lateral faces of the notional regular triangular prism 136. Thus, there is one LED support surface 104 for each lateral face of the notional regular triangular prism 136 whereby the LED support surfaces define a complete triangular prism. As can be seen in FIG. 3, the light-emitting surfaces of the LEDs 114 are also outwardly facing.

Figure 4:
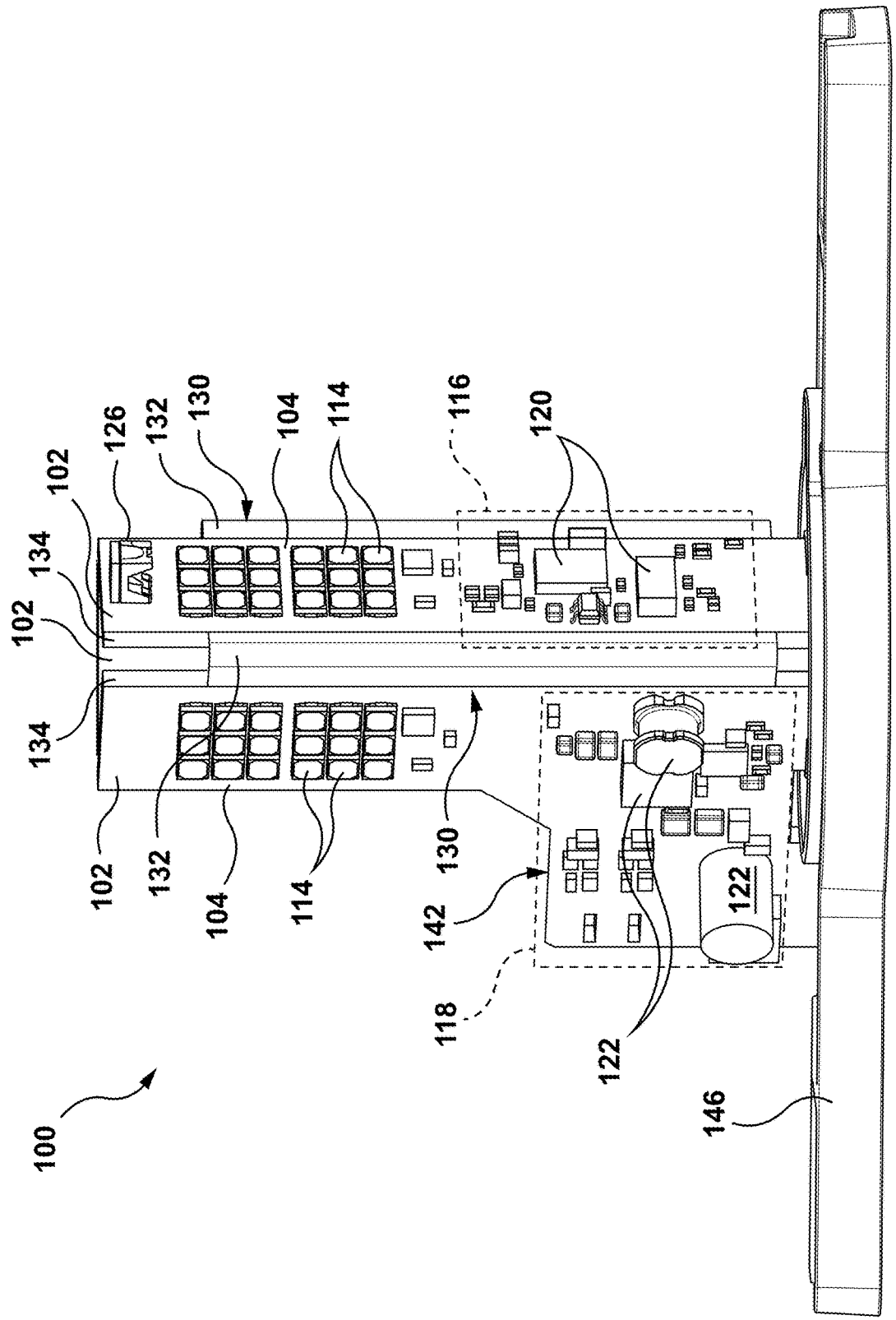
FIG. 4 is a side view showing the beacon skeleton of FIG. 1 folded into the generally triangular shape and securely potted onto a base.

As can be seen in FIG. 1, each of the LED heat sinks 102 includes a fastening aperture 144 into which potting compound will flow when potting the beacon skeleton 100 into a base. FIG. 4 shows the beacon skeleton 100, with the LED heat sinks 102 folded into the generally triangular shape 140 (FIG. 3), with the LED heat sinks 102 securely potted onto a base 146. The base 146 may also be formed of any suitable material such as an appropriate polymer or polycarbonate, or may be formed of metal, so as to serve as an additional heat sink. The shape of the base 146 is merely illustrative, and the beacon skeleton 100, with the LED heat sinks 102 folded into the generally triangular shape 140, may be potted into bases having a wide range of shapes and configurations depending on the application.

Figure 5:
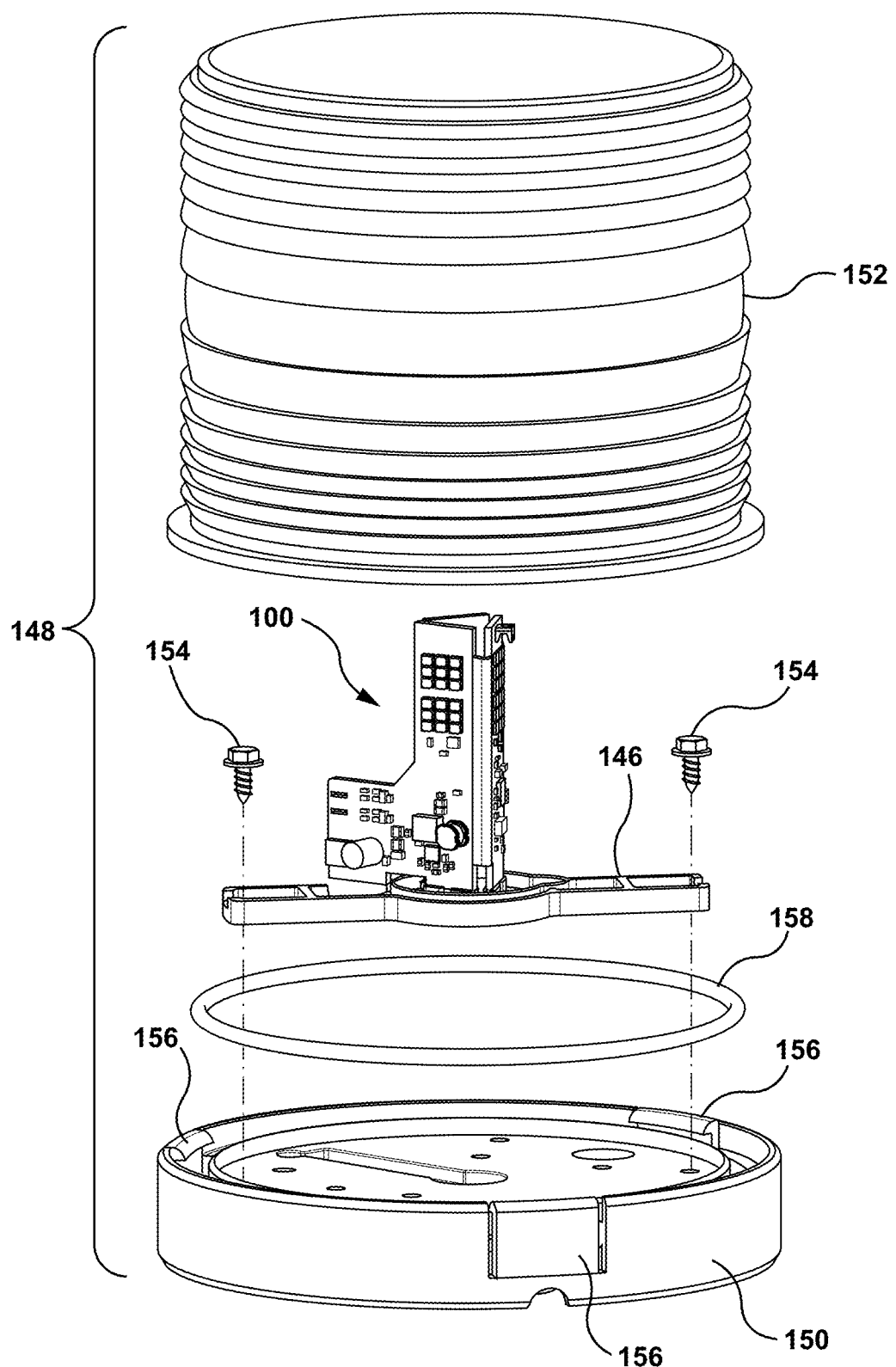
FIG. 5 is an exploded perspective view of a first light beacon incorporating the beacon skeleton of FIG. 1.

FIG. 5 shows how the combination of the beacon skeleton 100 and the base 146 may be disposed within an enclosure 148 comprising a pedestal 150 supporting the base 146 and a translucent housing 152 that cooperates with the pedestal 150 to form the enclosure 148. In the illustrated embodiment, the base 146 may be secured to the pedestal 150 by bolts 154, and the pedestal 150 includes circumferentially spaced resilient clips 156 for securing the housing 152 to the pedestal 150 to form the enclosure 148. An O-ring 158 is disposed between the pedestal 150 and the housing 152 to provide a weather-resistant seal. The housing 152 may be transparent, or may comprise a filter interposed between the LEDs 114 and a notional viewer, with the filter being configured to suppress light outside of a target color region. The target color region may be, for example, an SAE J578 specification for one of white, red, amber, green, restricted blue and signal blue. The housing 152 may comprise a Fresnel lens as shown, or may have other suitable configurations. The structure shown in FIG. 5 is merely one illustrative embodiment, and is not intended to be limiting.

Figure 6:
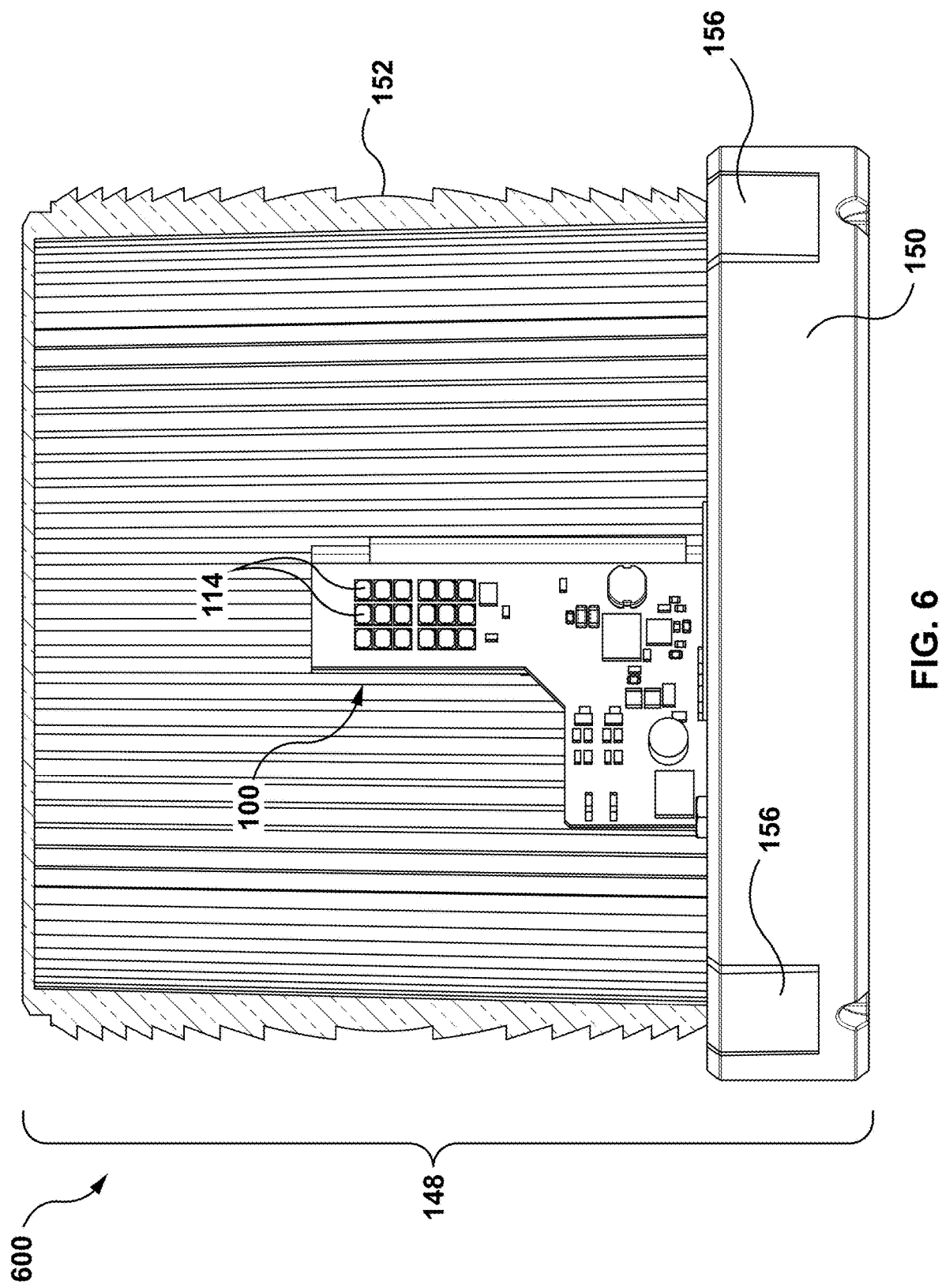
FIG. 6 is a partial cutaway view of the light beacon of FIG. 5.

FIG. 6 is a partial cut-away view showing an illustrative beacon 600 comprising the beacon skeleton 100, with the LED heat sinks 102 folded into the generally triangular shape 140 and potted onto the base 146, all disposed within the enclosure 148 comprising the pedestal 150 and the housing 152 that cooperates with the pedestal 150 to form the enclosure 148.

Figure 7:
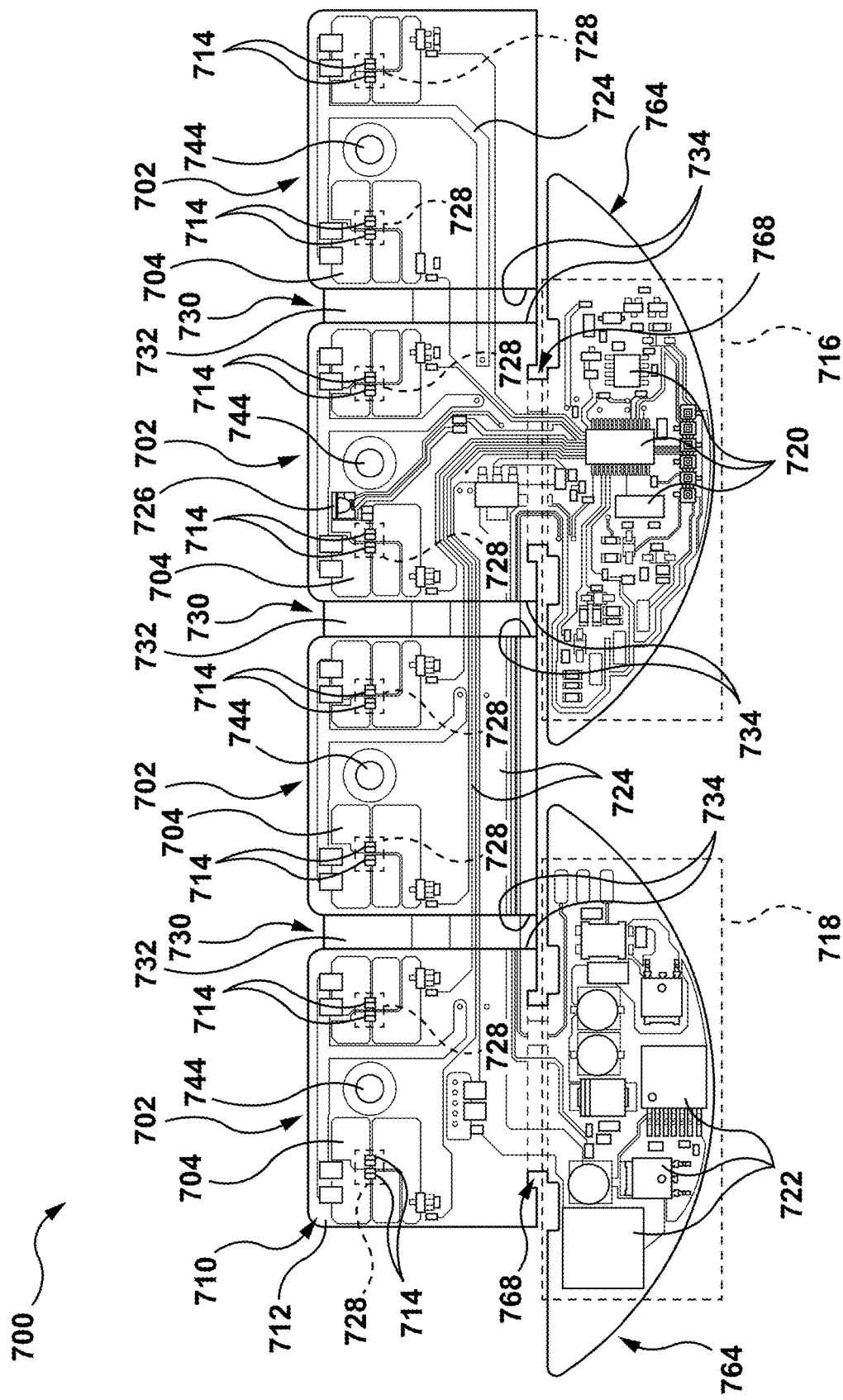
FIG. 7 shows a plan view of a second illustrative beacon skeleton for forming a light beacon in an unfolded configuration.

Reference is now made to FIG. 7, which shows a second illustrative beacon skeleton 700 for forming a light beacon. The beacon skeleton 700 shown in FIG. 7 is similar to the beacon skeleton 100 shown in FIG. 1, with like references denoting like features except with the prefix "7" instead of "1". The beacon skeleton 700 shown in FIG. 7 differs from the beacon skeleton 100 shown in FIG. 1 in that the beacon skeleton 700 has four separate individual rigid metal LED heat sinks 702. Each of the LED heat sinks 702 has a respective substantially planar LED support surface 704 which will be outwardly facing when the beacon skeleton 700 is formed into a light beacon.

Like the beacon skeleton 100 in FIG. 1, the beacon skeleton 700 in FIG. 7 further comprises a flexible printed circuit board 710 including a flexible substrate 712 and a plurality of LEDs 714, an electrical control module 716, a power supply module 718, an optional photosensor 726 and electrical traces 724, all carried by the substrate 712. As with the beacon skeleton 100 in FIG. 1, for the beacon skeleton 700 the LED regions 728 of the flexible printed circuit board 710 are disposed on the LED support surfaces 704 of the LED heat sinks 702, enabling the LED heat sinks 702 to dissipate heat from the LEDs 714. Unlike the beacon skeleton 100 in FIG. 1, for the beacon skeleton 700 in FIG. 7 the electrical control components 720 and the electrical input components 722 are not disposed on the LED heat sinks 702. Instead, the electrical control components 720 making up the electrical control module 716 and the electrical input components 722 making up the power supply module 718 are disposed on additional rigid metal component heat sinks 764 that are separate and distinct from the LED heat sinks 702 on which the LED regions 728 containing the LEDs 714 are disposed. Again, the particular arrangement of LEDs shown in the drawings is merely illustrative, and a wide range of LED configurations, with more or fewer LEDs at additional and/or alternate locations, is contemplated. In the illustrated embodiment, respective segment-shaped portions of the flexible printed circuit board 710 containing the electrical control components 720 and the electrical input components 722 are each disposed on a respective corresponding segment-shaped component heat sink 764. In alternate embodiments, some of the electrical control components and the electrical input components may be disposed on non-heat-sink material, such as rigid FR4 material, which is flexibly coupled to the heat sinks (e.g. by connecting portions of the flexible substrate).

Adjacent LED heat sinks 702 are foldably coupled to one another by fold regions 732 of the flexible printed circuit board 710, which form joints or hinges 730 extending between the edges 734 of adjacent LED heat sinks 702. Similarly, each of the component heat sinks 764 is adjacent to one of the LED heat sinks 702 and foldably coupled thereto by additional fold regions 768.

Figure 8A:
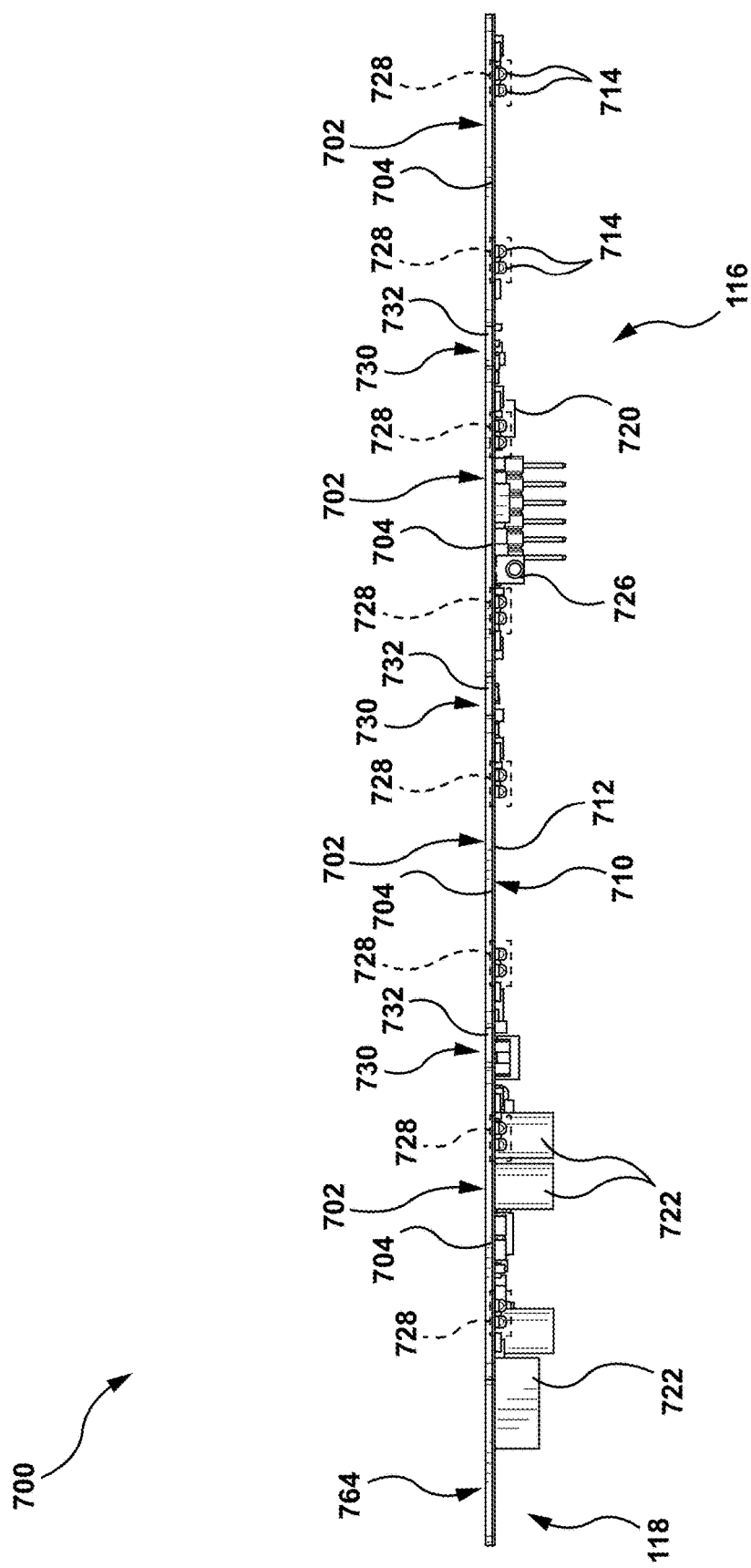
FIGS. 8A to 8C show how heat sinks of the beacon skeleton of FIG. 7 may be folded to form a generally square shape.
Figure 8B:
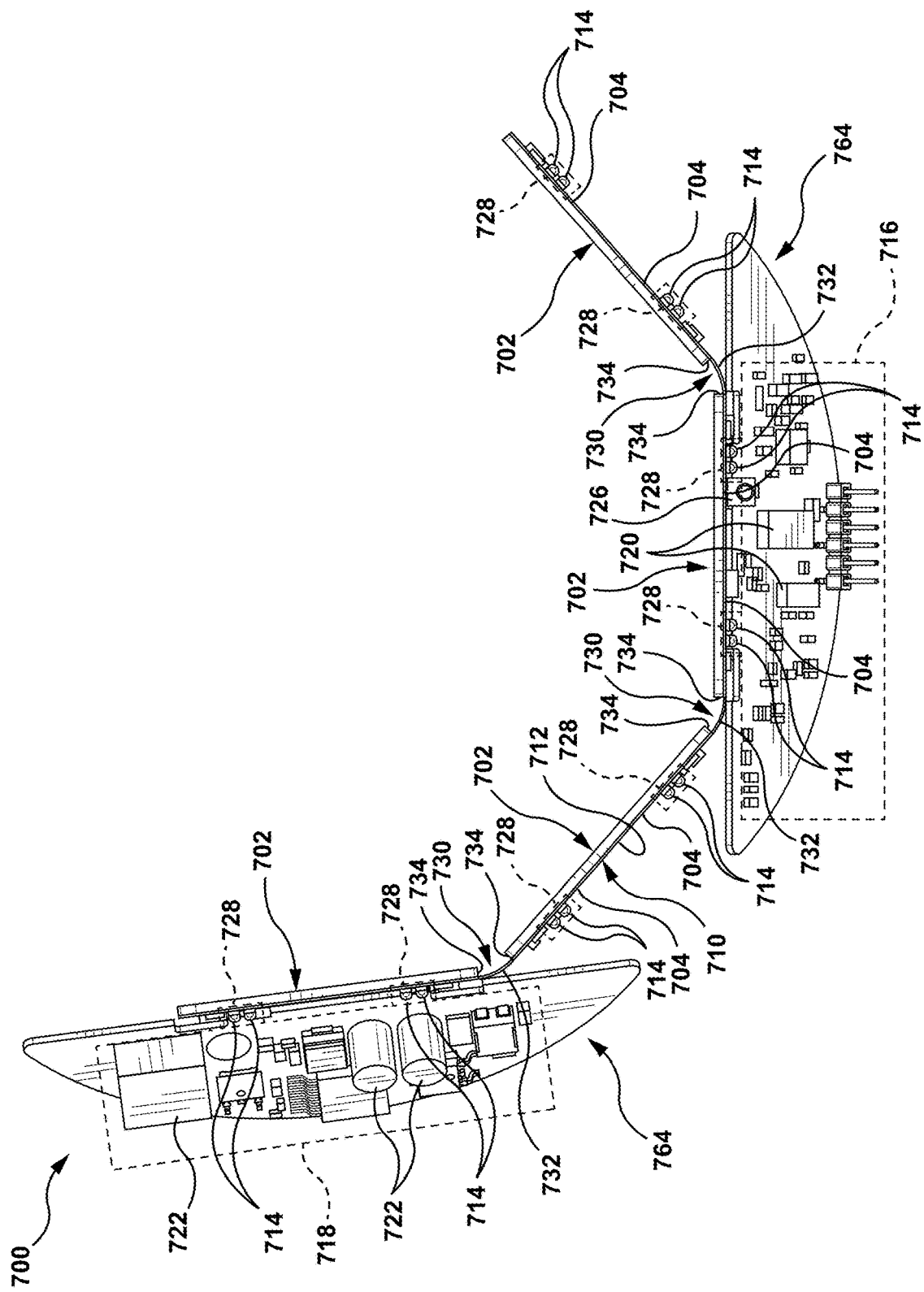
Figure 8C:
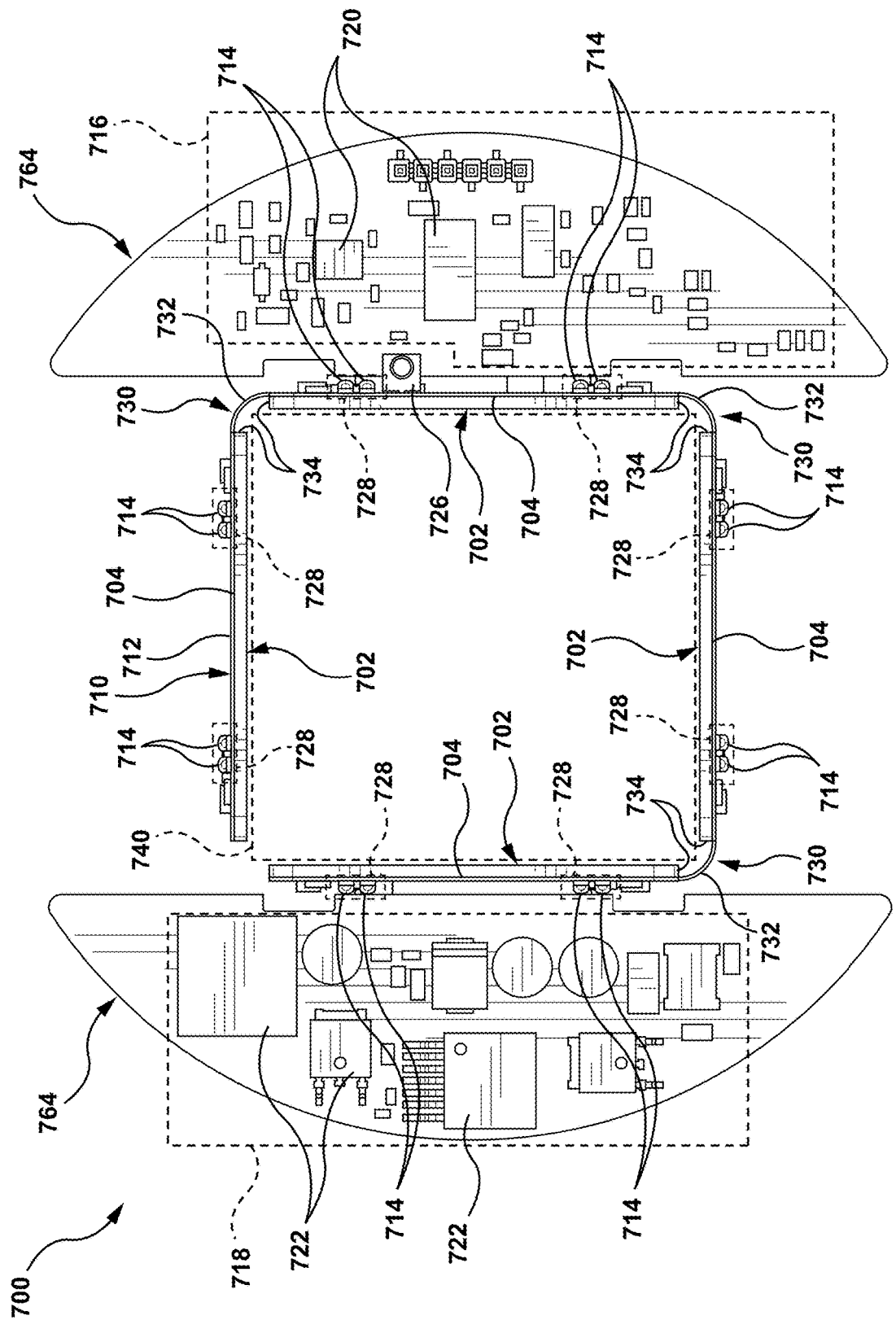

The fold regions 732 between the adjacent LED heat sinks 702 allow the LED heat sinks 702 to be folded toward one another to form a generally square shape 740, and the additional fold regions 768 between the LED heat sinks 702 and the component heat sinks 764 allow the component heat sinks 764, carrying the electrical control module 716 and the power supply module 718 of the flexible printed circuit board 710, to be folded outwardly relative to the generally square shape 740 (FIG. 8C). Folding of the LED heat sinks 702 and the component heat sinks 764 is shown in FIGS. 8A to 8C.

Referring now specifically to FIG. 8C, when the four LED heat sinks 702 are folded into the generally square shape 740, the LED support surfaces 704 face outwardly and define a notional polyhedron, particularly a notional prism and more particularly a notional rectangular prism (square being a special case of a rectangle). Thus, although the outwardly facing LED support surfaces 704 on opposed LED heat sinks 702 are substantially parallel, the LED heat sinks 702 are arranged relative to one another so that each adjacent pair of outwardly facing LED support surfaces 704 are non-parallel to one another, with the outwardly facing LED support surfaces 704 disposed on all of the notional lateral faces of the notional rectangular prism. Thus, there is one LED support surface 704 for each lateral face of the notional regular rectangular prism whereby the LED support surfaces define a complete rectangular prism. As can be seen in FIG. 8C, the light-emitting surfaces of the LEDs 714 are also outwardly facing. The component heat sinks 764 extend outwardly from opposite sides of the generally square shape 740, substantially perpendicular to the LED heat sinks 702 (FIG. 8C).

Figure 9:
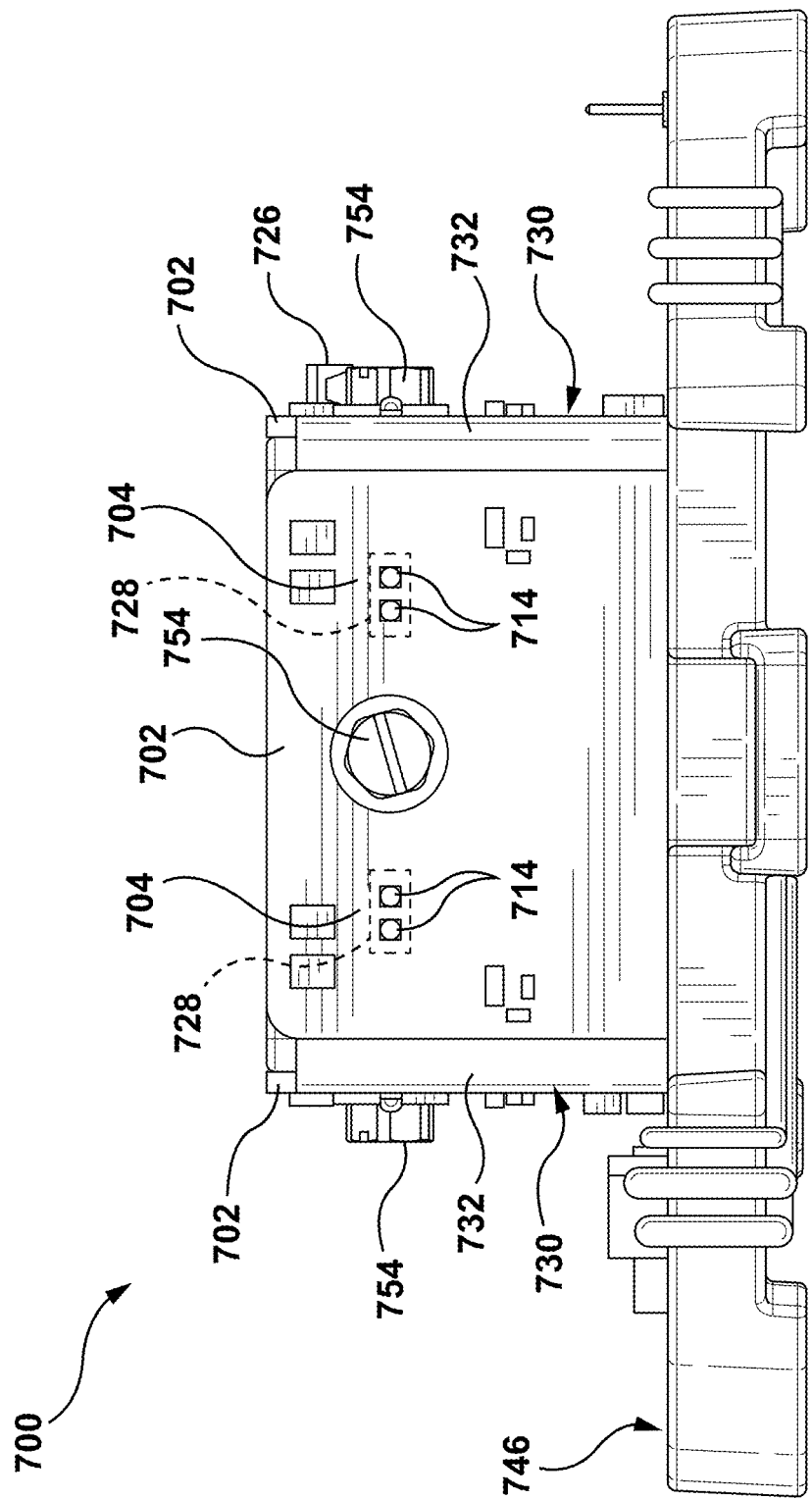
FIG. 9 is a side view showing the beacon skeleton of FIG. 7 with the heat sinks thereof folded into the generally square shape and securely potted onto a base.

As with the beacon skeleton 100 in FIG. 1, for the beacon skeleton 700 each of the LED heat sinks 702 includes a fastening aperture 744 (FIG. 7). FIG. 9 shows the beacon skeleton 700, with the LED heat sinks 702 folded into the generally square shape 740 (FIG. 8C), with the LED heat sinks 7 securely potted onto a base 746, which may also be formed of metal so as to serve as a supplemental internal heat sink that is thermally coupled to the LED heat sinks 702 and is disposed within the notional polyhedron.

Figure 10:
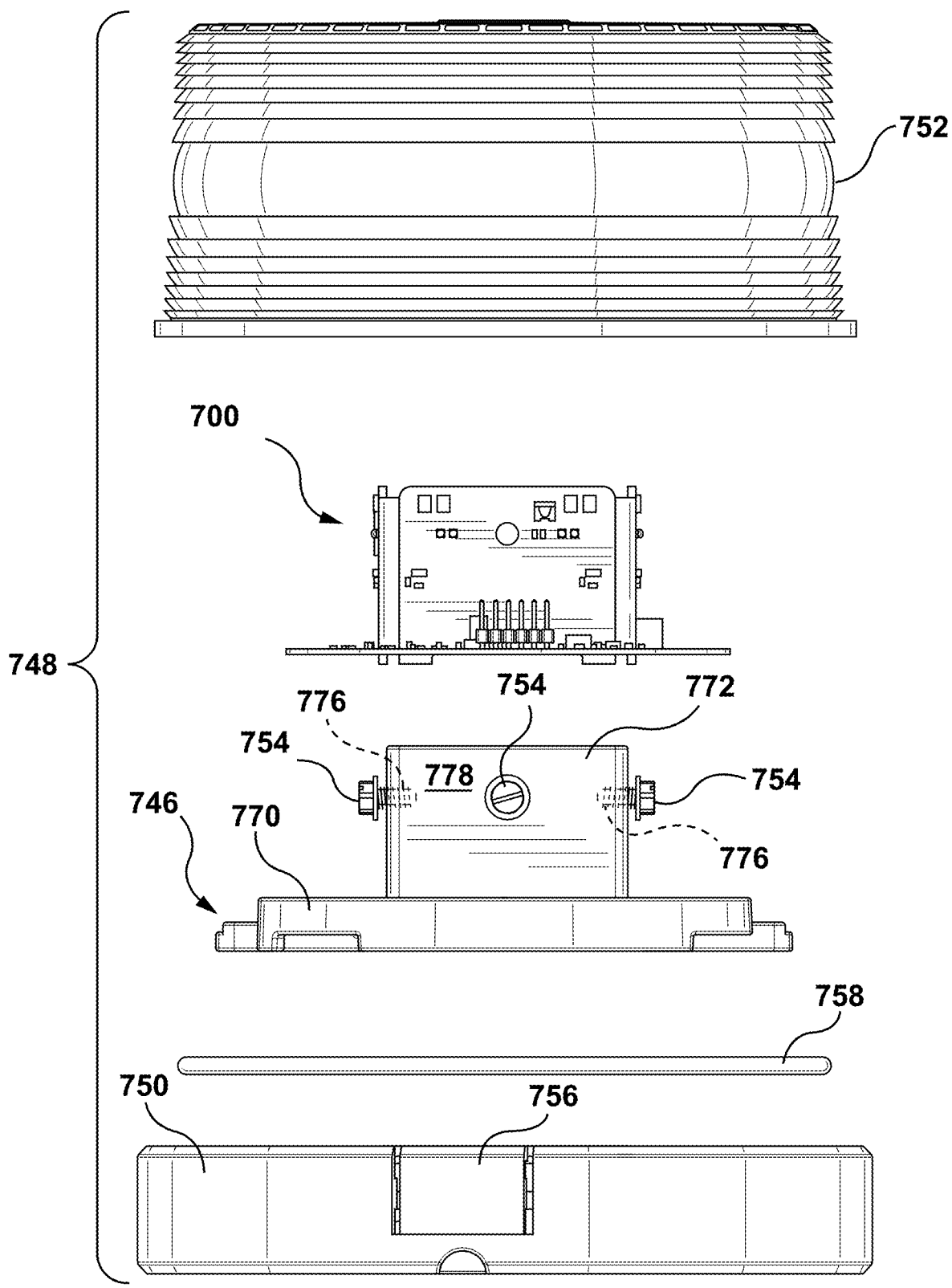
FIG. 10 is an exploded perspective view of a second light beacon incorporating the beacon skeleton of FIG. 7.

As better seen in FIG. 10, the base 746 comprises a generally orbicular platform 770 supporting a upstanding central column 772 sized and shaped to fit within the generally square shape 740 formed by the folded LED heat sinks 702. The folded LED heat sinks 702 may be secured to the column 772 by fasteners such as bolts 754 passing through the fastening apertures 744 in the LED heat sinks 702 into co-located bores 776 in the faces 778 of the column 772. Clips or other suitable fasteners may be used in lieu of bolts, or the folded LED heat sinks may be secured to the column by suitable adhesive. Recesses may be formed in the platform 770 to accommodate the outwardly extending component heat sinks 764.

FIG. 10 also shows how the assembly comprising the beacon skeleton 700 and the base 746 may be disposed within an enclosure 748 to form a beacon. The enclosure 748 comprises a pedestal 750 and a translucent housing 752 that cooperates with the pedestal 750 to form the enclosure 748. The pedestal 750 supports the base 746 within the enclosure 748, which may be bolted to the pedestal 750. Circumferentially spaced resilient clips 756 are provided on the pedestal 750 to secure the housing 752 to the pedestal 750 to form the enclosure 748, and an O-ring 758 between the pedestal 750 and the housing 752 provides a weather-resistant seal. The housing 752 may be transparent, or may comprise a filter configured to suppress light outside of a target color region, such as SAE J578 specification for one of white, red, amber, green, restricted blue and signal blue, and may comprise a Fresnel lens as shown, or may have other suitable configurations. The structure shown in FIG. 10 is merely one illustrative embodiment, and is not intended to be limiting.

Figure 11:
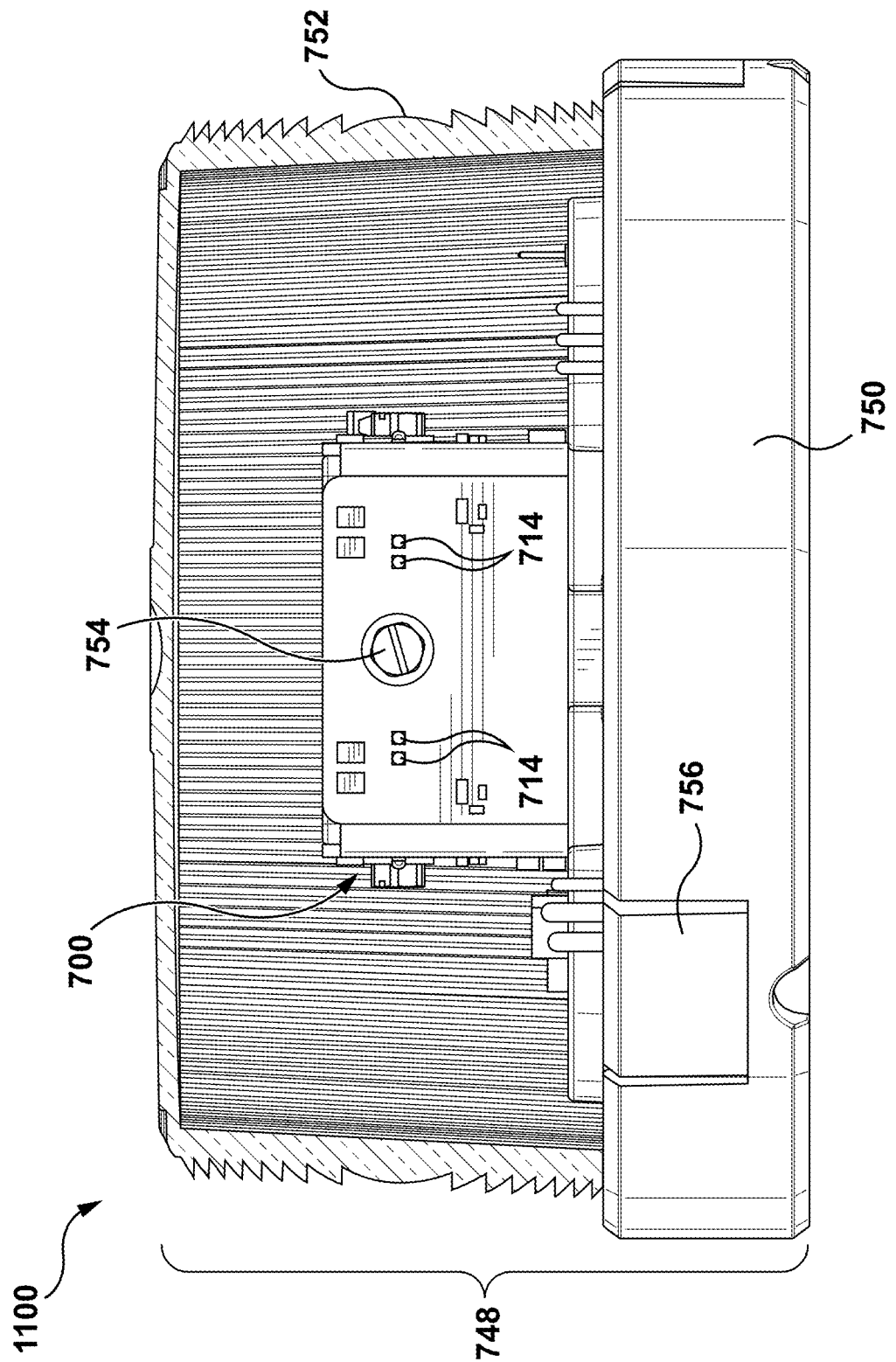
FIG. 11 is a partial cutaway view of the light beacon of FIG. 10.

FIG. 11 is a partial cut-away view showing an illustrative beacon 1100. The beacon 1100 comprises the beacon skeleton 700 potted onto the base 746, with the LED heat sinks 702 folded into the generally square shape 740 and the component heat sinks 764 extending outwardly, all disposed within the enclosure 748 comprising the pedestal 750 and the housing 752.

The arrangement and layout of the LEDs 114, 714, electrical control components 120, 720, electrical input components 122, 722 and electrical traces 124, 724 shown in the FIGS. is intended as a general, non-limiting representation, and is not intended to depict the specific layout of a functional circuit, the design and implementation of which is within the capability of one skilled in the art, as informed by the present disclosure.

In the illustrated embodiments, the beacon skeletons 100, 700 have been structured so that the outwardly facing LED support surfaces 104, 704 are disposed only on notional lateral faces of the notional prism, with the beacon skeletons 100, 700 being open at the end faces of the notional prism. In other embodiments, beacon skeletons may be constructed so that one of the outwardly facing LED support surfaces is disposed on a base face of the notional prism, with those LEDs directed upwardly relative to the beacon.

In addition it should be noted that while in the illustrated embodiments the notional polyhedron on whose faces the LED support surfaces are disposed takes the form of a regular prism (square or triangular), beacons and beacon skeletons according to the present disclosure are not so limited. Pentagons, hexagons, octagons and other types of prism are also contemplated. Further, the notional polyhedron is not limited to regular prisms, or even to prisms generally. Beacon skeletons according to the present disclosure may be constructed such that the LED heat sinks can be folded to have the LED support surfaces disposed on faces of any suitable regular or non-regular polyhedron.

Moreover, while in the illustrative embodiment there is one LED support surface for each lateral face of the notional prism, other embodiments are contemplated in which one or more of the lateral faces of the notional prism have no corresponding LED support surface.

The specific beacon configurations shown in the drawings are merely illustrative, and light beacons incorporating the principles of the present disclosure may have a wide range of shapes and configurations. For example, and without limitation, the four-sided arrangement shown in FIGS. 7 to 11 may be modified to have a taller profile (i.e. longer heat sinks and taller column), with a greater number of LEDs, with sets of LEDs positioned at vertical intervals.

Additionally, while the illustrated embodiments take the form of light beacons, the present disclosure is not so limited, and may be applied to light bars and other types of light systems.

Certain illustrative embodiments have been described by way of example. It will be apparent to persons skilled in the art that a number of variations and modifications can be made without departing from the scope of the invention as defined in the claims.

What is claimed is:
1. A light system, comprising:
   at least three separate individual rigid metal LED heat sinks each having a respective substantially planar outwardly facing LED support surface;
   a flexible printed circuit board comprising:
      a flexible substrate;
      a plurality of LEDs carried by the substrate;
      a plurality of electrical control components carried by the substrate and adapted for selectively controlling illumination of the LEDs;
      a plurality of electrical input components carried by the substrate and connectible in electrical communication with an electrical source to supply electrical power to the flexible printed circuit board; and
      a plurality of electrical traces carried by the substrate and in electrical communication with the LEDs, the electrical control components and the electrical input components;
   wherein the electrical traces are configured to cooperate with the electrical control components and the electrical input components to form a circuit configured to carry current from the electrical source through the

LEDs and back to the electrical source under control of the electrical control components and the electrical input components;

wherein LED regions of the flexible printed circuit board carrying the LEDs are disposed on the outwardly facing LED support surfaces of the LED heat sinks whereby the LED heat sinks can dissipate heat from the LEDs and wherein light-emitting surfaces of the LEDs are outwardly facing;

wherein adjacent ones of the LED heat sinks are foldably coupled to one another by joints formed by fold regions of the flexible printed circuit board extending between respective spaced-apart edges of the adjacent ones of the LED heat sinks;

wherein the LED heat sinks are arranged relative to one another so that each adjacent pair of the outwardly facing LED support surfaces are non-parallel to one another whereby the outwardly facing LED support surfaces are disposed on notional faces of a notional polyhedron.

2. The light system of claim 1, wherein the notional polyhedron is a notional prism and the outwardly facing LED support surfaces are disposed on notional lateral faces of the notional prism.

3. The light system of claim 2, wherein the outwardly facing LED support surfaces are disposed on all of the notional lateral faces of the notional prism.

4. The light system of claim 2, wherein one of the outwardly facing LED support surfaces is disposed on a base face of the notional prism.

5. The light system of claim 3, wherein the notional prism is a notional triangular prism.

6. The light system of claim 3, wherein the notional prism is a notional rectangular prism.

7. The light system of claim 1, further comprising a supplemental internal heat sink that is thermally coupled to the LED heat sinks and is disposed within the notional polyhedron.

8. The light system of claim 1, further comprising a base wherein the LED heat sinks are securely potted onto the base.

9. The light system of claim 8, wherein the LED heat sinks, the flexible printed circuit board and the base are disposed within an enclosure comprising a pedestal supporting the base and a translucent housing that cooperates with the pedestal to form the enclosure.

10. The light system of claim 9, wherein the housing is transparent.

11. The light system of claim 9, wherein the housing comprises a filter interposed between the LEDs and a notional viewer, the filter being configured to suppress light outside of a target color region.

12. The light system of claim 11, wherein the target color region is an SAE J578 specification for one of white, red, amber, green, restricted blue and signal blue.

13. The light system of claim 9, wherein the housing comprises a Fresnel lens.

14. The light system of claim 1, further comprising a photosensor carried by the substrate, wherein the photosensor is in electrical communication with the electrical control components and the electrical control components are adapted for selectively controlling illumination of the LEDs at least partially according to input from the photosensor.

* * * * *